(12) United States Patent
Gu et al.

(10) Patent No.: US 11,594,441 B2
(45) Date of Patent: Feb. 28, 2023

(54) HANDLING FOR HIGH RESISTIVITY SUBSTRATES

(71) Applicant: Applied Materials, Inc., Santa Clara, CA (US)

(72) Inventors: Sipeng Gu, Gloucester, MA (US); Kyu-Ha Shim, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/226,277

(22) Filed: Apr. 9, 2021

(65) Prior Publication Data

US 2022/0328337 A1 Oct. 13, 2022

(51) Int. Cl.
| | | |
|---|---|---|
| *C23C 14/00* | (2006.01) | |
| *H01L 21/683* | (2006.01) | |
| *C23C 14/08* | (2006.01) | |
| *C23C 14/06* | (2006.01) | |
| *C23C 14/48* | (2006.01) | |

(52) U.S. Cl.
CPC ...... *H01L 21/6833* (2013.01); *C23C 14/0605* (2013.01); *C23C 14/083* (2013.01); *C23C 14/48* (2013.01)

(58) Field of Classification Search
CPC ................................ H01L 21/00; C23C 14/00
See application file for complete search history.

(56) References Cited

U.S. PATENT DOCUMENTS

| | | | | |
|---|---|---|---|---|
| 2007/0080605 | A1* | 4/2007 | Chandrashekhar | ...... G21H 1/02 310/303 |
| 2009/0125141 | A1 | 5/2009 | Noda et al. | |

(Continued)

FOREIGN PATENT DOCUMENTS

| | | |
|---|---|---|
| JP | 2003-86816 A | 3/2003 |
| KR | 10-2008-0070829 A | 7/2008 |

OTHER PUBLICATIONS

"Boron-implanted GH-SiC diodes" Mario Ghezzo, Dale M. Brown, Evan Downey, and James Kretchmer, Appl. Phys. Lett. 63 (91, Aug. 30, (Year: 1993).*

(Continued)

*Primary Examiner* — David P Turocy
*Assistant Examiner* — Mohammad Mayy
(74) *Attorney, Agent, or Firm* — Nields, Lemack & Frame, LLC

(57) ABSTRACT

A method of modifying a high-resistivity substrate so that the substrate may be electrostatically clamped to a chuck is disclosed. The bottom surface is implanted with a resistivity-reducing species. In this way, resistivity of the bottom surface of the substrate may be greatly reduced. In some embodiments, to implant the bottom surface, a coating is applied to the top surface. After application of the coating, the substrate is flipped so that the front surface contacts the top surface of the chuck. The ions are then implanted into the exposed bottom surface to create the low resistivity layer. The resistivity of the low resistivity layer proximate the bottom surface after implant may be less than 1000 ohm-cm. Once the bottom surface has been implanted, the substrate may be processed conventionally. The low resistivity layer may later be removed by wafer backside thinning processes.

16 Claims, 2 Drawing Sheets

(56) References Cited

U.S. PATENT DOCUMENTS

2010/0093161 A1* 4/2010 Kusumoto .......... H01L 29/7802
438/522
2013/0143411 A1 6/2013 Cheng
2014/0327116 A1 11/2014 Konishi et al.

OTHER PUBLICATIONS

"Silicon Carbide MOSFET Technology", D. M. Brown, E. Downey, M. Ghezzo, J. Kretchmer, V. Krishnamurthy, W. Hennessy and G. Michon, Solid-State Electronics vol. 39, No. 11. pp. 1531-1542, (Year: 1996).*
"Structure and mechanical properties of low stress tetrahedral amorphous carbon films prepared by pulsed laser deposition", M. Bonelli, A.C. Ferrari, A. Fioravanti, A. Li Bassi, A. Miotello, and P.M. Ossi, Eur. Phys. J. B 25, 269-280, (Year: 2002).*
International Search Report and Written Opinion dated Jul. 4, 2022 in corresponding PCT application No. PCT/US2022/020337.

* cited by examiner

HANDLING FOR HIGH RESISTIVITY SUBSTRATES

FIELD

Embodiments of the present disclosure relate to a method for improved handling of substrates, and particularly, high resistivity substrates.

BACKGROUND

Substrates are fabricated using a plurality of processes to create a semiconductor device. In many of these processes, the substrate is clamped to a surface so that the substrate remains stationary throughout the process.

This clamping may be accomplished using mechanical clamping, where the substrate is physically attached to the chuck. While effective, mechanical clamping may lead to contamination, poor process uniformity, reduced useful wafer area, or damage to the substrate by backside gas pressure.

Alternatively, electrostatic forces may be used to clamp the substrate to the chuck. Electric fields are created within the chuck. These electric fields cause electrons in the substrate to be drawn to the bottom surface of the substrate, where they are attracted to positive charges in the chuck. This attraction serves to clamp the substrate to the chuck.

Electrostatic clamping is very effective and reduces the possibility of contamination or damage to the substrate. However, this technique relies on the fact that the substrate has a fairly low resistivity. This allows the free movement of electrons within the substrate so as to create the electrostatic clamping force.

Substrates with high resistivity, such as high-res silicon, silicon carbide and gallium arsenide, do not generate the same clamping forces as silicon substrates. In fact, in one test, the current generated in the electrostatic chuck is tripled when a silicon substrate is disposed on the chuck, as compared to the situation when the chuck is unpopulated. In contrast, when a high resistivity substrate is disposed on the chuck, the current generated in the chuck is nearly the same as when the chuck is unpopulated.

Because of this, these high resistivity substrates are difficult to process. For example, application of back side gas at low pressures may cause the substrate to become unclamped. Meanwhile, the low chuck force will be a restraint to the use of high pressure backside gas, which is used for wafer cooling in some cases. Additionally, these substrates may be susceptible to damage that is caused by the inability to dissipate accumulated charge to the chuck.

Therefore, a method of processing a high resistivity substrate so that it may be electrostatically clamped to a chuck would be beneficial. Further, it would be advantageous if this method did not negatively impact throughput or introduce many additional fabrication processes.

SUMMARY

A method of modifying a high-resistivity substrate so that the substrate may be electrostatically clamped to a chuck is disclosed. The bottom surface is implanted with a resistivity-reducing species. In this way, resistivity of the bottom surface of the substrate may be greatly reduced. In some embodiments, to implant the bottom surface, a coating is applied to the top surface. After application of the coating, the substrate is flipped so that the front surface contacts the top surface of the chuck.

The ions are then implanted into the exposed bottom surface to create the low resistivity layer. The resistivity of the low resistivity layer proximate the bottom surface after implant may be less than 1000 ohm-cm. Once the bottom surface has been implanted, the substrate may be processed conventionally. The low resistivity layer may later be removed by wafer backside thinning processes while, in some embodiments the layer will be plated or metallized to form an electrode for a vertical transistor.

According to one embodiment, a method of processing a high resistivity substrate to enable electrostatic clamping is disclosed. The method comprises applying a coating to a top surface of the high resistivity substrate; implanting ions into a bottom surface of the high resistivity substrate to form a low resistivity layer; removing the coating, such that the high resistivity substrate comprises the low resistivity layer proximate its bottom surface that may be clamped to an electrostatic chuck. In some embodiments, the coating is a low resistivity material, such that, prior to implanting the ions, the high resistivity substrate is flipped so that the coating is in contact with a top surface of the electrostatic chuck and the coating allows the high resistivity substrate to be clamped to the electrostatic chuck. In certain embodiments, the coating comprises amorphous carbon or titanium oxide. In certain embodiments, the ions reduce a resistivity of the low resistivity layer by at least five orders of magnitude relative to the resistivity of the high resistivity substrate. In some embodiments, the ions reduce the resistivity of the low resistivity layer to less than 1000 ohm-cm. In certain embodiments, the ions reduce the resistivity of the low resistivity layer to less than 100 ohm-cm. In some embodiments, the high resistivity substrate comprises a GaAs substrate, and the ions comprise silicon. In certain embodiments, the high resistivity substrate comprises a SiC substrate, and the ions comprise phosphorus, aluminum or boron. In some embodiments, the high resistivity substrate comprises a high-res silicon substrate, and the ions comprise phosphorus or boron. In certain embodiments, the implanting is performed using a non-zero tilt angle. In some embodiments, the ions are implanted such that a peak concentration of ions occurs at a depth of less than 500 nanometers. In certain embodiments, the low resistivity layer is later removed. In certain embodiments, the low resistivity layer is later plated or metallized to form an electrode.

According to another embodiment, a method of processing a high resistivity substrate to enable electrostatic clamping, wherein the high resistivity substrate comprises a sacrificial layer having a low resistivity disposed on a top surface, is disclosed. The method comprises implanting ions into a bottom surface of the high resistivity substrate, wherein high resistivity substrate is flipped so that the sacrificial layer is in contact with a top surface of an electrostatic chuck and the sacrificial layer allows the high resistivity substrate to be clamped to the electrostatic chuck; wherein after the implanting, the high resistivity substrate comprises a low resistivity layer proximate its bottom surface that may be clamped to the electrostatic chuck. In certain embodiments, the ions reduce a resistivity of the low resistivity layer by at least five orders of magnitude relative to the resistivity of the high resistivity substrate. In some embodiments, the ions reduce the resistivity of the low resistivity layer to less than 1000 ohm-cm. In certain embodiments, the ions reduce the resistivity of the low resistivity layer to less than 100 ohm-cm. In certain embodiments, the implanting is performed using a non-zero tilt angle. In some embodiments, the ions are implanted such that a peak concentration of ions occurs at a depth of less than 500 nanometers. In certain embodiments, the high resistivity substrate comprises a GaAs substrate, a SiC substrate or a high-res silicon substrate, and the ions comprise silicon, phosphorus, aluminum, or boron.

According to another embodiment, a high resistivity substrate suitable for electrostatic clamping is disclosed. The high resistivity substrate comprises a low resistivity layer disposed within the substrate, wherein the low resistivity layer comprises a resistivity-reducing species, and wherein a resistivity of the low resistivity layer is 1000 ohm-cm or less. In certain embodiments, a peak concentration of the resistivity-reducing species is disposed at a depth between 2 nanometers and 2 micrometers.

BRIEF DESCRIPTION OF THE FIGURES

For a better understanding of the present disclosure, reference is made to the accompanying drawings, which are incorporated herein by reference and in which.

DETAILED DESCRIPTION

As noted above, the use of high resistivity substrates with electrostatic chucks may be problematic due to the weak clamping forces that are created. To address this, a method to improve the ability to handle these high resistivity substrates, and more particularly, to utilize these high resistivity substrates with electrostatic chucks is disclosed.

FIGS. 1A-1F show the high resistivity substrate as this method is applied to that substrate. FIG. 2 illustrates a flow chart showing the processes involved in this method.

Figure 1A:
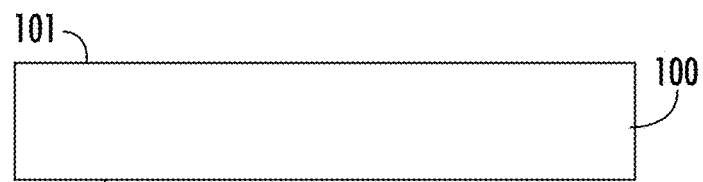
FIGS. 1A-1F shows a high resistivity substrate as it is being processed.
Figure 2:
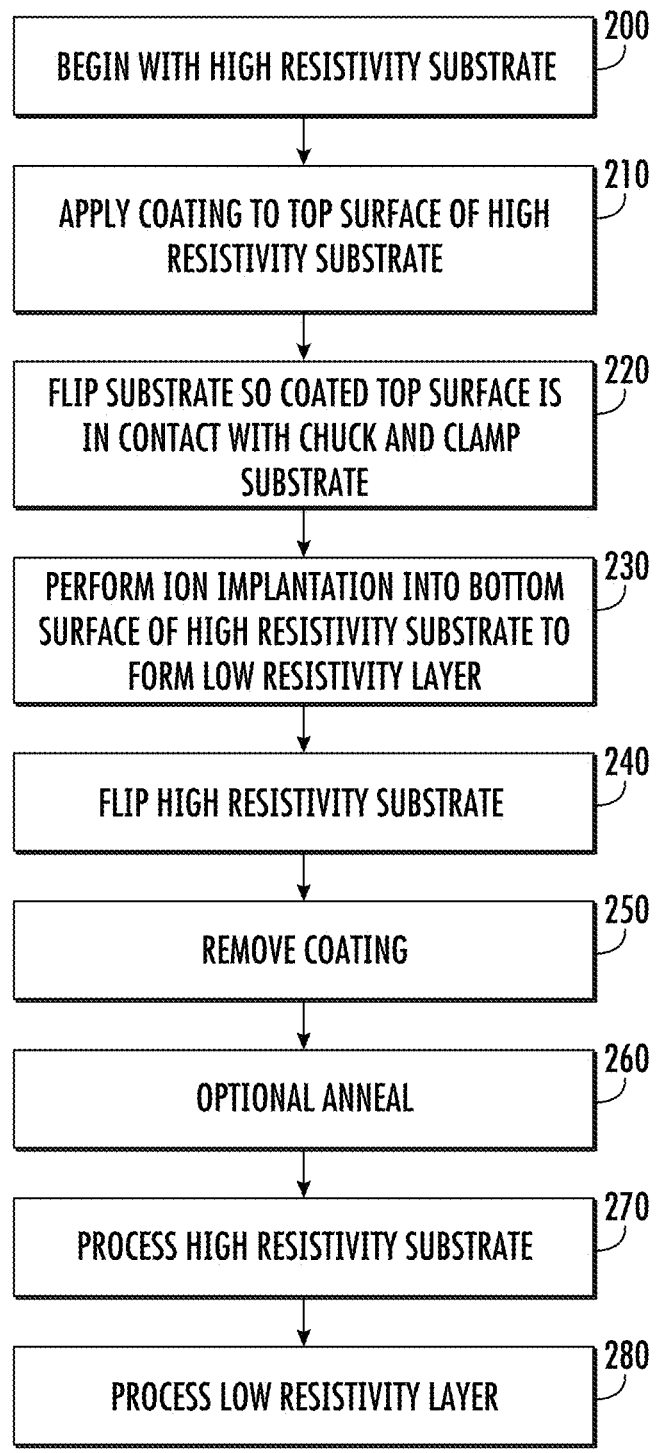
FIG. 2 is a flowchart showing the processes undergone by the high resistivity substrate according to one embodiment.

The method begins with a high resistivity substrate 100, as shown in FIG. 1A and Box 200 of FIG. 2. The high resistivity substrate 100 may be gallium arsenide (GaAs), silicon carbide (SiC), high resistivity silicon (Hi-Res Si) or other high resistivity substrates. A high resistivity substrate is defined as a substrate having a resistivity equal to or greater than 1E4 ohm-cm. In some embodiments, the high resistivity substrate may have a resistivity equal to or greater than 1E8. In certain embodiments, the method described herein is performed prior to any other fabrication processes. In some embodiments, it may be inserted into the fabrication process flow before the first process which utilizes electrostatic clamping. The thickness of the high resistivity substrate 100 is not limited by this embodiment and may be up to several microns thick.

Figure 1B:
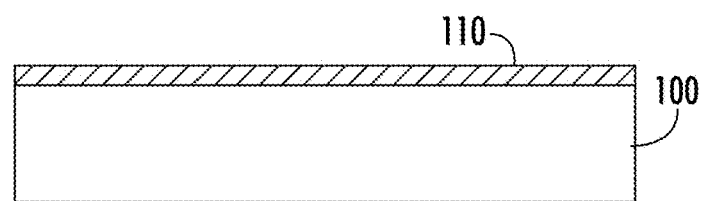

Next, a coating 110 is applied to the top surface 101 of the high resistivity substrate 100, as shown in Box 210 and FIG. 1B. This coating 110 may have low resistivity, such as less than 1000 ohm-cm. In certain embodiments, the coating 110 may be a resistivity of less than 300 ohm-cm. The coating 110 may be amorphous carbon (a-C), titanium oxide ($TiO_x$) or another suitable material. In certain embodiments, the coating 110 is selected due to the ease of application. In certain embodiments, the coating 110 may be applied through a spin coating, chemical vapor deposition (CVD), physical vapor deposition (PVD), atomic layer deposition (ALD), or other suitable methods. The thickness of this coating 110 is not limited by the disclosure, as the coating will be removed at a later time. Thus, the coating 110 may have a thickness between 2 nm and 5 micrometers.

Figure 1C:
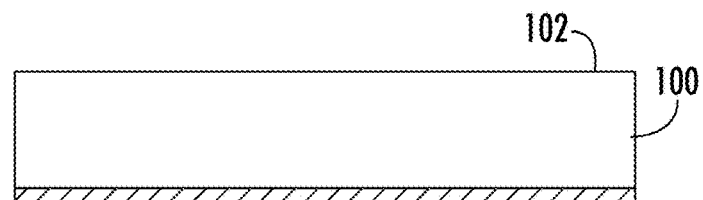

Next, as shown in Box 220 and FIG. 1C, the high resistivity substrate 100 is flipped, so that the top surface 101 with the coating 110 is in contact with the top surface of the chuck. Note that because the coating 110 is made of a low resistivity material, an electrostatic chuck may be used. The electrostatic forces of the electrostatic chuck are able to clamp the high resistivity substrate due to the coating 110.

Figure 1D:
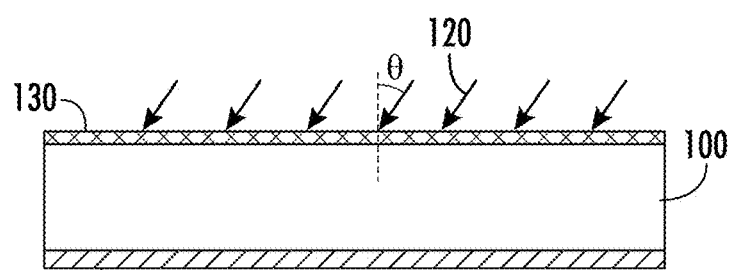

Next, as shown in Box 230 and FIG. 1D, an ion implantation process is performed so as to implant ions 120 into the exposed bottom surface of the high resistivity substrate 100. The ion implantation process is performed using ions 120 of a species that will reduce the resistivity of the high resistivity substrate 100, also referred to as a resistivity-reducing species. For example, for a SiC substrate, the resistivity-reducing species may be aluminum, boron, phosphorus or another suitable species. For a Hi-Res Si substrate, the resistivity-reducing species may be boron, phosphorus or another suitable species. For a GaAs substrate, the resistivity-reducing species may be silicon or another suitable species.

The energy of the ion implant process may be selected such that the thickness of the implanted region is between 2 nm and 5 micrometers, for example. In certain embodiments, the thickness may be between 2 nm and 500 nm. For GaAs substrates, this energy may be between 5 Kev and 10 MeV. Of source, other thicknesses may also be used, depending on the overall thickness of the high resistivity substrate.

The dose of the ion implantation process may be sufficient such that the implanted region becomes a low resistivity layer having a resistivity of less than 1000 ohm-cm. In certain embodiments, the dose may be such that the resistivity of the low resistivity layer 130 becomes 100 ohm-cm or less. For GaAs substrates, the dose may be between 1E13 and 1E18 atoms/$cm^2$, or, in certain embodiments, between 1E14 and 1E16 atoms/$cm^2$. GaAs substrates may have a resistivity of 1E8 to 1E10 ohms-cm. Thus, the ion implantation process reduces the resistivity of the implanted portion of the high resistivity substrate by more than five orders of magnitude, and may reduce the resistivity by six orders of magnitude or more. Similar implantation processes using suitable species may be performed for SiC, high-res and other high resistivity substrates.

In certain embodiments, the ion implantation process may be performed using a non-zero tilt angle to minimize channeling. FIG. 1D shows a non-zero tilt angle ($\theta$) being used to implant ions 120. This non-zero tilt angle may be between 1 and 60°. In other embodiments, a non-zero tilt angle may not be utilized.

For example, in one test, silicon ions were implanted into a GaAs substrate with a tilt angle of 45° (relative to a perpendicular implant, which is defined as 0°). The energy of the ions was 30 keV and the dose was between 1E14 and 1E15 atoms/$cm^2$. The thickness of the resulting low resistivity layer 130 was less than 100 nanometers, and in certain embodiments, the peak concentration (Rp) was at a depth of roughly 50 nanometers.

Thus, the low resistivity layer 130 may be created using a shallow implant such that the concentration of ions is near the bottom surface of the substrate. The peak concentration may be disposed at a depth between 2 nanometers and 2 micrometers, depending on the thickness of the substrate. In certain embodiments, the peak concentration may be at a depth less than 500 nanometers. In some embodiments, the peak concentration may be at a depth less than 250 nanometers. In some embodiments, the peak concentration may be at a depth less than 1000 nanometers.

Figure 1E:
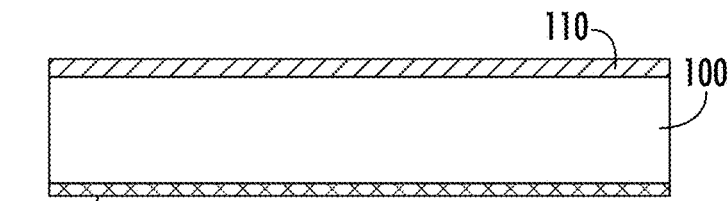

As shown in Box 240 and FIG. 1E, after the ion implantation process, the high resistivity substrate 100 may be flipped again, such that the bottom surface 102 with the low resistivity layer 130 may be in contact with the top surface of the chuck. The coating 110 is exposed.

Figure 1F:
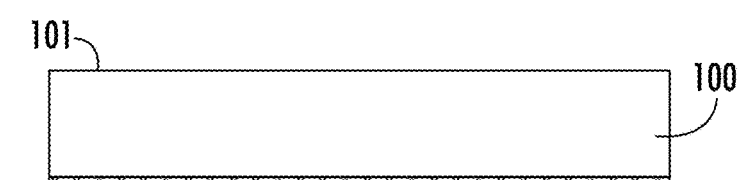

Next, as shown in Box 250 and FIG. 1F, the coating 110 may be removed. In certain embodiments, the coating 110 may be removed using a reactive ion etch (RIE) process, wet clean process, mechanical polishing, chemical mechanical polishing, or other film removing processes. In other embodiments, where the coating 110 comprises amorphous carbon, an oxygen asking process may be utilized.

Thus, after removal of the coating 110, the high resistivity substrate 100 with the low resistivity layer 130, disposed proximate its bottom surface, is ready for further processing. Note that the high resistivity substrate is unchanged, except for the inclusion of the low resistivity layer 130 proximate the bottom surface. The low resistivity layer 130 may have a thickness of 2 nanometers to 3 micrometers. In certain embodiments, the thickness of the low resistivity layer 130 may be less than 1 micrometer thick. In some embodiments, the thickness may be less than 500 nanometers. In some embodiments, the thickness may be less than 250 nanometers. In some embodiments, the thickness may be less than 100 nanometers.

In certain embodiments, as shown in Box 260, an anneal process is performed after the ion implantation process to repair any damage in the low resistivity layer 130. However, in certain embodiments, during normal processing, the high resistivity substrate may later be subjected to an anneal process. In these embodiments, it may be possible to eliminate the dedicated anneal process shown in Box 260. A variety of anneal processes may be used for this purpose, such as furnace (300°-100° C., 10-60 min), rapid thermal anneal (1050° C.-1200° C. and 5 s-20 s), or laser anneal processes (>1000° C., a few tens of nanoseconds).

Next, the high resistivity substrate 100 may be processed in accordance with existing fabrication processes, as shown in Box 270. For example, the high resistivity substrate 100 may be fabricated to form transistors, power devices, optical devices, solar cells, sensors, or other components. The inclusion of the low resistivity layer 130 proximate the bottom surface 102 of the high resistivity substrate 100 allows the high resistivity substrate 100 to be clamped using conventional electrostatic chucks.

After the fabrication of the high resistivity substrate 100 is complete, the low resistivity layer 130 is processed, as shown in Box 280. In one embodiment, the low resistivity layer 130 is removed using conventional wafer thinning techniques. In other embodiments, such as embodiments where vertical transistors are formed, the low resistivity layer 130 may be plated or metallized to form one or more electrodes.

While FIGS. 1A-1F and FIG. 2 show one method to modify a high resistivity substrate to allow it to be utilized with electrostatic chucks, other methods are also possible.

For example, in certain embodiments, the high resistivity substrates may initially have a sacrificial top layer. This sacrificial layer with a low resistivity is used as a hardmask or a transfer layer during patterning processes. This sacrificial top layer may act as the coating described above, and may be used for clamping during backside ion implantation processes to form low resistivity layer 130.

In this scenario, Box 210 of FIG. 2 may be optional. Further, the removal of the coating, shown in Box 250 may also be optional. In other words, the sacrificial layer may serve as the coating described above.

Thus, the present disclosure described several methods of processing a high resistivity substrate to enable electrostatic clamping. In addition, a high resistivity substrate that is capable of being electrostatically clamped is also disclosed. The high resistivity substrate comprises a low resistivity layer disposed within the substrate. This low resistivity layer may be created using ion implantation of a resistivity-reducing species and may have a resistivity of 1000 ohm-cm or less. In some embodiments, the low resistivity layer may have a resistivity of 100 ohm-cm or less. Further, the peak concentration of the resistivity-reducing species (Rp) may be disposed at a depth between 2 nanometers and 2 micrometers.

The embodiments described above in the present application may have many advantages. As described above, high resistivity substrates cannot be properly clamped using electrostatic forces. By adding a low resistivity layer proximate the bottom surface of the high resistivity substrate, these substrates can be clamped similar to traditional silicon substrates with no modifications to the electrostatic chuck.

Further, by incorporating the low resistivity layer, charges that accumulate on the high resistivity substrate during processing may be dissipated to the chuck. This reduces the possibility of damage.

Finally, the RC time constant for substrate clamp and declamp times may be modeled as follows:

$$RC = \varepsilon \frac{(\rho_{chuck} \times d_{chuck}) + (\rho_{wafer} \times d_{wafer})}{gap}$$

where $\rho_{chuck}$ is the resistivity of the dielectric layer of the chuck, $d_{chuck}$ is the thickness of the dielectric layer, $\rho_{wafer}$ is the resistivity of the substrate, $d_{wafer}$ is the thickness of the substrate, and gap is the thickness of the gap between the chuck and the substrate. For a high-resistivity substrate having a $\rho_{wafer}$ of 1E8 ohm-cm or more, the second term of the numerator dominates the RC constant, which may be greater than 100 seconds. By adding a low resistivity layer having a resistivity that is at least five orders of magnitude less than that of the substrate, the RC constant can be reduced to less than 0.5 second.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a high resistivity substrate, comprising:
    applying a coating to a top surface of the high resistivity substrate, wherein the coating is a low resistivity material;

flipping the high resistivity substrate so that the coating is in contact with a top surface of an electrostatic chuck and the coating allows the high resistivity substrate to be clamped to the electrostatic chuck;

implanting ions into a bottom surface of the high resistivity substrate while clamped to the electrostatic chuck to form a low resistivity layer, wherein the low resistivity layer has a thickness between 2 nanometers to 3 micrometers;

removing the coating, such that the high resistivity substrate comprises the low resistivity layer proximate its bottom surface that may be clamped to an electrostatic chuck;

clamping the bottom surface to the electrostatic chuck;

processing the top surface of the high resistivity substrate while clamped to the electrostatic chuck; and removing the low resistivity layer after the high resistivity substrate is removed from the electrostatic chuck.

2. The method of claim 1, wherein the coating comprises amorphous carbon or titanium oxide and is applied using spin coating, chemical vapor deposition (CVD), physical vapor deposition (PVD), or atomic layer deposition (ALD).

3. The method of claim 1, wherein a dose of the ions is sufficient to reduce a resistivity of the low resistivity layer by at least five orders of magnitude relative to the resistivity of the high resistivity substrate.

4. The method of claim 1, wherein a dose of the ions is sufficient to reduce a resistivity of the low resistivity layer to less than 1000 ohm-cm.

5. The method of claim 4, wherein the dose of the ions is sufficient to reduce the resistivity of the low resistivity layer to less than 100 ohm-cm.

6. The method of claim 1, wherein the high resistivity substrate comprises a GaAs substrate, a SiC substrate or a high-res silicon substrate, and the ions comprise silicon, phosphorus, aluminum or boron.

7. The method of claim 1, wherein the implanting is performed using a non-zero tilt angle.

8. The method of claim 1, wherein the ions are implanted such that a peak concentration of ions occurs at a depth of less than 500 nanometers.

9. A method of processing a high resistivity substrate, wherein the high resistivity substrate comprises a sacrificial layer having a low resistivity disposed on a top surface, comprising:

implanting ions into a bottom surface of the high resistivity substrate, wherein the high resistivity substrate is flipped so that the sacrificial layer is in contact with a top surface of an electrostatic chuck and the sacrificial layer allows the high resistivity substrate to be clamped to the electrostatic chuck;

wherein after the implanting, the high resistivity substrate comprises a low resistivity layer proximate its bottom surface that may be clamped to the electrostatic chuck, wherein the low resistivity layer has a thickness between 2 nanometers to 3 micrometers;

clamping the bottom surface to the electrostatic chuck;

processing the top surface of the high resistivity substrate while clamped to the electrostatic chuck; and removing the low resistivity layer after the high resistivity substrate is removed from the electrostatic chuck.

10. The method of claim 9, wherein a dose of the ions is sufficient to reduce a resistivity of the low resistivity layer by at least five orders of magnitude relative to the resistivity of the high resistivity substrate.

11. The method of claim 9, wherein a dose of the ions is sufficient to reduce a resistivity of the low resistivity layer to less than 1000 ohm-cm.

12. The method of claim 11, wherein the dose of the ions is sufficient to reduce the resistivity of the low resistivity layer to less than 100 ohm-cm.

13. The method of claim 9, wherein the implanting is performed using a non-zero tilt angle.

14. The method of claim 9, wherein the ions are implanted such that a peak concentration of ions occurs at a depth of less than 500 nanometers.

15. The method of claim 9, wherein the high resistivity substrate comprises a GaAs substrate, a SiC substrate or a high-res silicon substrate, and the ions comprise silicon, phosphorus, aluminum, or boron.

16. The method of claim 9, wherein the sacrificial layer is used as a hardmask or a transfer layer during patterning processes.

* * * * *